US006800552B2

United States Patent
Elers et al.

(10) Patent No.: US 6,800,552 B2
(45) Date of Patent: *Oct. 5, 2004

(54) DEPOSITION OF TRANSITION METAL CARBIDES

(75) Inventors: Kai-Erik Elers, Helsinki (FI); Suvi P. Haukka, Helsinki (FI); Ville Antero Saanila, Helsinki (FI); Sari Johanna Kaipio, Järvenpää (FI); Pekka Juha Soininen, Espoo (FI)

(73) Assignee: ASM International, N.V. (NL)

( * ) Notice: Subject to any disclaimer, the term of this patent is extended or adjusted under 35 U.S.C. 154(b) by 1 day.

This patent is subject to a terminal disclaimer.

(21) Appl. No.: 10/246,131

(22) Filed: Sep. 17, 2002

(65) Prior Publication Data

US 2003/0031807 A1 Feb. 13, 2003

Related U.S. Application Data (63) Continuation of application No. 09/687,204, filed on Oct. 13, 2000, now Pat. No. 6,482,262.
(60) Provisional application No. 60/176,948, filed on Jan. 18, 2000, and provisional application No. 60/159,799, filed on Oct. 15, 1999.

(30) Foreign Application Priority Data

| Oct. 15, 1999 | (FI) | FI19992233 |
|---|---|---|
| Oct. 15, 1999 | (FI) | FI19992234 |
| Oct. 15, 1999 | (FI) | FI19992235 |
| Mar. 10, 2000 | (FI) | FI20000564 |

(51) Int. Cl.$^7$ ............................................. C23C 16/32

(52) U.S. Cl. .................. 438/680; 438/685; 427/249.1; 427/249.17; 427/249.18; 427/249.19

(58) Field of Search ................. 117/74, 88; 427/249.1, 427/249.17, 249.18, 249.19; 438/680, 685

(56) References Cited

U.S. PATENT DOCUMENTS

| 4,058,430 A | 11/1977 | Suntola et al. ............... 156/611 |
| 5,281,274 A | * 1/1994 | Yoder ......................... 118/697 |
| 5,306,666 A | 4/1994 | Izumi |

(List continued on next page.)

FOREIGN PATENT DOCUMENTS

| EP | 0 387 403 A1 | 10/1989 | |
| EP | 0 394 054 A1 | 4/1990 | |
| EP | 0 573 033 A1 | 6/1993 | |
| EP | 573033 A1 | * 12/1993 | ........... C23C/16/32 |
| EP | 0 774533 A1 | 10/1996 | |
| EP | 0 442 490 A1 | 8/2001 | |
| EP | 1 167 567 A1 | 1/2002 | |
| JP | 6037041 | 2/1994 | |
| JP | 6069157 | 3/1994 | |
| JP | 7230957 | 8/1995 | |
| WO | WO 96/18756 | 6/1996 | |
| WO | WO 98/51838 | 11/1998 | |
| WO | WO 00/01006 | 1/2000 | |
| WO | WO 00/47796 | 8/2000 | |

OTHER PUBLICATIONS

Kim et al., Applied Physics Letters, vol. 82, No. 25, pp. 4486–4488, (Jun. 23, 2003).*

(List continued on next page.)

Primary Examiner—Timothy Meeks
(74) Attorney, Agent, or Firm—Knobbe, Martens, Olson & Bear LLP.

(57) ABSTRACT

The present invention relates generally to a method of depositing transition metal carbide thin films. In particular, the invention concerns a method of depositing transition metal carbide thin films by atomic layer deposition (ALD), in which a transition metal source compound and a carbon source compound are alternately provided to the substrate. A variety of metal and carbon source gases are disclosed. The methods are applicable to forming metal carbide thin films in semiconductor fabrication, and particularly to forming thin, conductive diffusion barriers within integrated circuits.

35 Claims, 2 Drawing Sheets

U.S. PATENT DOCUMENTS

| | | | |
|---|---|---|---|
| 5,316,793 | A | 5/1994 | Wallace et al. |
| 5,711,811 | A | 1/1998 | Suntola et al. ............... 118/711 |
| 5,789,024 | A | 8/1998 | Levy et al. |
| 5,916,365 | A | 6/1999 | Sherman ....................... 117/92 |
| 5,946,598 | A | 8/1999 | Yeh |
| 6,006,763 | A | 12/1999 | Mori et al. |
| 6,099,904 | A | 8/2000 | Mak et al. |
| 6,156,382 | A | 12/2000 | Rajagopalan et al. |
| 6,206,967 | B1 | 3/2001 | Mak et al. |
| 6,380,627 | B1 | 4/2002 | Weihs et al. |
| 6,482,262 | B1 * | 11/2002 | Elers et al. .................... 117/84 |
| 2003/0049931 | A1 | 3/2003 | Byun et al. |
| 2003/0104126 | A1 | 6/2003 | Fang et al. |
| 2003/0123216 | A1 | 7/2003 | Yoon et al. |
| 2003/0127043 | A1 | 7/2003 | Lu et al. |
| 2003/0153181 | A1 | 8/2003 | Yoon et al. |
| 2003/0157760 | A1 | 8/2003 | Xi et al. |
| 2003/0161952 | A1 | 8/2003 | Wang et al. |
| 2003/0181035 | A1 | 9/2003 | Yoon et al. |
| 2003/0194825 | A1 | 10/2003 | Law et al. |
| 2003/0203616 | A1 | 10/2003 | Chung et al. |

OTHER PUBLICATIONS

Yang et al., "Atomic Layer Deposition of Tungsten Film from WF6/B2H6: Nucleation Layer for Advanced Semiconductor Devices." Advanced Metallization Conference 2001 (AMC 2001), Conference Proceedings ULSI XVII@2002 Materials Research Society, pp. 655–660.

Bain et al., "Deposition of tungsten by plasma enhanced chemical vapour deposition," *J. Phys. IV France*, vol. 9, pp. 827–833 (1999).

Juppo et al., "Deposition of copper films by an alternate supply of CuCl and Zn," *J. Vac. Sci. Technol A*, vol. 15, No. 4, pp. 2330–2333, (Jul./Aug. 1997).

Klaus et al., "Atomic Layer Deposition of Tungsten Nitride Films Using Sequential Surface Reactions," *Journal of the Electrochemical Society*, vol. 147, No. 3, pp. 1175–1181, (2000).

Klaus et al., "Atomic layer deposition of tungsten using sequential surface chemistry with a sacrificial stripping reaction," *Thin Solid Films*, vol. 360, pp. 145–153, (2000).

Ludviksson et al., "Low–Temperature Thermal CVD of Ti–Al Metal Films Using a Strong Reducing Agent," *Chem. Vap. Deposition*, vol. 4, No. 4, pp. 129–132, (1998).

Martensson et al., "Atomic Layer Epitaxy of Copper and Tantalum," *Chemical Vapor Deposition*, vol. 3, No. 1, pp. 45–50, (1997).

Martensson et al., "CU(THD)$_2$ As Copper Source in Atomic Layer Epitaxy," *Electrochemical Society Proceedings*, vol. 97–25, pp. 1529–1536.

Martensson, "Use of atomic layer epitaxy for fabrication of Si/TiN/Cu structures," *J. Vac. Sci. Technol. B*, vol. 17, No. 5, pp. 2122–2128, (Sep./Oct. 1999).

Polyakov et al., "Growth of GaBN Ternary Soloutions by Organometallic Vapor Phase Epitaxy," *Journal of Electronic Materials*, Vo. 26, No. 3, pp. 237–242, (1997).

Sherman et al., "Plasma enhanced atomic layer deposition of Ta for diffusion barrier applications," AVS 46$^{th}$ International Symposium, Paper TF–TuM5 (abstract), (Oct. 26, 1999), Seattle, WA.

"Kirk–Othmer Encyclopedia of Chemical Technology," 4$^{th}$ Edition, vol. 4, John Wiley & Sons, Inc. pp. 841–878, (1992).

Favis et al., "Atomic layer epitaxy of silicon, silicon/germanium and silicon carbide via extraction/exchange processes" Avail. NTIS. Report (1991), 33 pp. From: Gov. Rep. Announce. Index (U.S.) 1991, 91(13), Abstr. No. 135,319.

Fuyuki et al., "Atomic layer epitaxy controlled by surface superstructures in silicon carbide" Thin Solid Films (1993), 225(1–2), 225–9.

Fuyuki et al., "Atomic layer epitaxy of cubic silicon carbide by gas source MBE using surface superstructure" J. Cryst. Growth (1989), 95(1–4), 461–3.

Hara et al., "Atomic layer control of .beta.–silicon carbide (001) surface" Springer Proc. Phys. (1992), 71(Amorphous and Crystalline Silicon Carbide IV), 90–5.

Jehn et al., "Gmelin Handbook of Inorganic and Organometallic Chemistry," 8$^{th}$ Edition, vol. A 5b, No. 54, pp. 131–154, (1993).

Klaus et al., "Atomically controlled growth of tungsten and tungsten nitride using sequential surface reactions," *Applied Surface Science*, vols. 162–163, pp. 479–491 (2000).

Lai et al., "Precursors for Organometallic Chemical Vapor Deposition of Tungsten Carbide Films," *Chem. Mater.*, vol. 7, pp. 2284–2292, (1995).

Matsunami et al., "Hetero–interface control and atomic layer epitaxy of SiC." Applied Surface Science (1997), 112 171–175.

Min et al., "Atomic Layer Deposition of TiN Films by Alternate Supply of Tetrakis (ethylmethylamino)–Titanium and Ammonia," *Jpn. J. Appl. Phys.*, vol. 37, pp. 4999–5004 (1998).

Min et al., "Atomic Layer Deposition of TiN Thin Films by Sequential Introduction of Ti Precursor and NH$_3$," *Mat. Res. Soc. Symp. Proc.*, vol. 514, pp 337–342 (1998).

Nakajima et al., "Chemical Vapor Deposition of Tungsten Carbide, Molybdenum Carbide Nitride, and Molybdenum Nitride Films," *J. Electrochem. Soc.*, vol. 144,. No. 6, pp. 2096–2100, (Jun. 1997).

Ritala et al., "Atomic Layer Epitaxy Growth of TiN Thin Films from TiI$_4$ and NH$_3$," *J. Electrochem. Soc.*, vol. 145, No. 8, pp. 2914–2920 (Aug. 1998).

Sadayuki et al., "Sub–atomic layer growth of SiC at low temperatures"Japanese Journal of Applied Physics, Part 1: Regular Papers, Short Notes & Review Papers (1995), 34(11), 6166–70.

Tulhoff et al., "Ullmann's Encyclopedia of Industrial Chemistry," 5th, Completely Revised Edition, vol. A5, pp. 61–77 (1986).

* cited by examiner

DEPOSITION OF TRANSITION METAL CARBIDES

REFERENCE TO RELATED APPLICATIONS

The present application is a continuation of application No. 09/687,204, filed Oct. 13, 2000, now U.S. Pat. No. 6,482,262, which claims the priority benefit under 35 U.S.C. §119(e) to U.S. Provisional Application Nos. 60/176,948, filed Jan. 18, 2000, and 60/159,799 filed Oct. 15, 1999, and under 35 U.S.C. §119(a) to Finnish Application Nos. FI20000564, filed Mar. 10, 2000, FI19992233, filed Oct. 15, 1999, FI19992234, filed Oct. 15, 1999 and FI19992235, filed Oct. 15, 1999.

BACKGROUND OF THE INVENTION

1. Field of the Invention

The present invention relates to the deposition of transition metal carbide thin films. More specifically, the present invention relates to the use of sequential self-saturating surface reactions to form transition metal carbides on various substrates.

2. Description of the Related Art

Carbides of transition metal elements in groups 4 (Ti, Zr, Hf), 5 (V, Nb, Ta) and 6 (Cr, Mo, W) of the periodic table possess several attractive properties. They are relatively inert, have very high melting points, are extremely hard and wear resistant, and have high thermal conductivity and metal-like electrical conductivity. For these reasons, transition metal carbides have been proposed for use as low resistance diffusion barriers in semiconductor fabrication (see, e.g., international patent application WO 00/01006; U.S. Pat. No. 5,916,365).

General information about metal carbides can be found, for example, in Ullmann's Encyclopedia of Industrial Chemistry, 5$^{th}$ Edition, Vol. A5, VCH Verlagsgesellschaft, 1986, pp. 61–77, and in the Kirk-Othmer Encyclopedia of Chemical Technology, 4$^{th}$ Edition, Vol. 4, John Wiley & Sons, Inc., 1992, pp. 841–878. Transition metal carbides can have a wide range of compositions. Ordered and disordered carbon deficient forms exist, of which the tungsten carbides $W_3C$, $W_2C$, WC and $WC_{1-x}$ are examples. In these forms, carbon resides in the interstitial cavities between metal atoms.

Suggested deposition methods include Chemical Vapor Deposition (CVD), Metal Organic Chemical Vapor Deposition (MOCVD) and Physical Vapor Deposition (PVD).

Carbides have been deposited by CVD type processes wherein more than one source chemical is present in the reaction space at the same time. A CVD method of depositing tungsten carbide from tungsten hexafluoride, hydrogen and a carbon-containing gas has been described, for example, in international patent application WO 00/47796. The carbon-containing gas is initially thermally activated. All of the gaseous source chemicals are present at the same time in the reaction space, resulting in the deposition of nonvolatile tungsten carbide on the substrate. A CVD reaction of $WF_6$ with trimethylamine and $H_2$ has been disclosed for yielding WC films at 700° C.–800° C. and beta-$WC_{1-x}$ films at 400° C.–600° C. (Nakajima et al., J. Electrochem. Soc. 144:2096–2100 (1997)). The $H_2$ flow rate affects the deposition rate of tungsten carbide. One problem with the disclosed process is that the substrate temperature is rather high relative to thermal budgets for state-of-the-art semiconductor fabrication, particularly in metallization stages.

MOCVD processes utilize organometallic compounds that are thermally decomposed on the substrate or combined with other organic compounds in gas phase and then contacted with the substrate thus breaking the source chemical molecules and forming the final product. Tungsten carbide has also been deposited on substrates by the thermal decomposition of organotungsten derivatives of $W(CO)_6$ at low pressures (Lai et al., Chem. Mater. 7:2284–2292 (1995)). Similarly, TiC has been deposited in a CVD process by the thermal decomposition of organometallic titanium compounds (Girolami et al., Mater. Res. Soc. Symp. Proc. 121:429–438 (1988)). U.S. Pat. No. 5,916,365 also discloses thermal decomposition of pentadimethyl-aminotantalum. In these processes, the source chemical molecules contain both the metal and the carbon. However it's utility on complex, irregular surfaces is not known.

PVD processes generally deposit along a line-of-sight. One method of depositing tantalum carbide for a diffusion barrier layer by PVD has been described in U.S. Pat. No. 5,973,400. The tantalum carbide layer was formed by sputtering tantalum or tantalum carbide under $N_2/CH_4/Ar$ atmosphere. Line of sight deposition, however, means that complex substrate contours will have insufficient thin film coverage in shaded areas. Additionally, line-of-sight deposition means that low-volatility source material arriving directly from the source to the substrate will likely adhere to the first solid surface that it encounters, thus producing low-conformality coverage.

Thus, there is a need in the art for improvements in methods of depositing transition metal carbides.

SUMMARY OF THE INVENTION

In accordance with one aspect of the invention, a method is disclosed for depositing a transition metal carbide thin film by an atomic layer deposition (ALD) process. In the illustrated embodiment, vapor-phase pulses of at least one transition metal source compound and at least one carbon source compound are alternately fed into a reaction space containing a substrate.

The transition metal source compound preferably comprises a metal source gas selected from the group consisting of Ti, Zr, Hf, V, Nb, Ta, Cr, Mo and W. An exemplary transition metal source gas is a metal halide, such as tungsten hexafluoride. Exemplary carbon source compounds include boron compounds, silicon compounds and phosphorous compounds. Desirably, in these exemplary source gas compounds, either boron, silicon or phosphorus bond directly to carbon.

The process is of particularly utility when depositing ultrathin, high quality layers, such as typically demanded in the field of semiconductor fabrication. For example, a metal carbide thin film can advantageously form thin diffusion barrier that is conductive and conformal over integrated circuit topography (e.g., dual damascene trenches and vias).

DETAILED DESCRIPTION OF THE PREFERRED EMBODIMENT

For the purpose of the present invention, an "atomic layer deposition" or "ALD" type process designates a process where the deposition of thin film onto a substrate is based on sequential and alternating self-saturating surface reactions. The principles of ALD are disclosed, e.g., in U.S. Pat. Nos. 4,058,430 and 5,711,811, the disclosures of which are hereby incorporated by reference herein.

"Substrate temperature" means a temperature that is maintained in the reaction space during the deposition process.

"Transition metals" means elements of groups 3 to 12 of the periodic table of the elements. A preferred subset of the transition metals are those of groups 5 (titanium, zirconium and hafnium), 6 (vanadium, niobium and tantalum) and 7 (chromium, molybdenum and tungsten) of the periodic table of the elements. Metal carbides of these elements contain interstitial carbon and have some of the properties of pure metals.

"Reaction space" is used to designate a reactor or reaction chamber in which the conditions can be adjusted so that deposition by ALD is possible.

In the preferred embodiment of the present invention, transition metal carbide thin films are prepared by a chemical gaseous deposition process. The preferred chemical gaseous deposition process is an atomic layer deposition (ALD) type process. The principles of ALD are well known to those skilled in the art.

According to a preferred ALD type process, a transition metal carbide thin film is grown on a substrate placed in a reaction space at an elevated temperature. Thus, a substrate is preferably placed in a reaction space and is subjected to sequential, alternately repeated surface reactions of at least two vapor-phase reactants such that a transition metal carbide thin film grows on the substrate. Preferably, the conditions in the reaction space are adjusted so that no gas-phase reactions, i.e., reactions between gaseous reactants, occur. In the preferred ALD type process, a metal source compound and a carbon source compound are alternately fed to the reaction space in gaseous form such that they are not present simultaneously in the gas phase in the reaction space. Thus, only surface reactions between species or complexes adsorbed by chemisorption on the surface of the substrate and gaseous reactants are allowed. The reactions are preferably self-saturating and self-limiting.

In the preferred ALD type process, the vapor-phase pulses of the transition metal source compound and the carbon source compound are alternately and sequentially fed into the reaction space and brought in contact with the surface of the substrate. The source compounds are preferably fed into the reaction space with the aid of an inert or noble carrier gas, such as nitrogen or argon. The "surface" of the substrate initially comprises the substrate material. In one embodiment the substrate has been pretreated in advance, e.g., by contacting it with a chemical for modifying the surface properties thereof. Once a transition metal carbide layer has been deposited, it forms the surface for any subsequent transition metal carbide layers.

Figure 2:
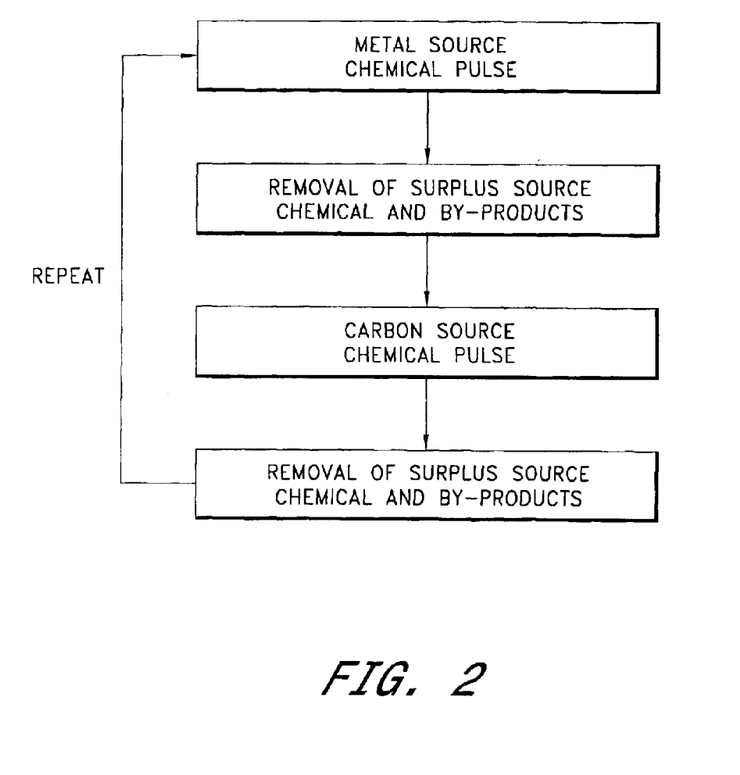
FIG. 2 presents a flow chart of the metal carbide ALD process.

One pulsing sequence or "cycle" is depicted in FIG. 2. Each cycle in the deposition preferably comprises:
  feeding a vapor-phase pulse of a transition metal source compound into the reaction space in an inert carrier gas;
  removing the surplus transition metal source compound and any gaseous by-products from the reaction space (e.g., by purging with an inert gas);
  feeding a vapor-phase pulse of a carbon source compound into the reaction space in an inert carrier gas; and
  removing the surplus carbon source compound and any gaseous by-products from the reaction space (e.g., by purging with an inert gas).

The cycle may be repeated as many times as desired to produce a transition metal carbide film of the desired thickness. The purging time is preferably selected to be long enough to prevent gas phase reactions and to prevent transition metal carbide thin film growth rates higher than one lattice constant of the transition metal carbide per cycle.

In one embodiment the deposition is carried out at atmospheric pressure. However, it is preferable to carry out the deposition at reduced pressure. The pressure in the reactor is preferably about 0.01 mbar to 50 mbar, and more preferably about 0.1 mbar to 10 mbar. The substrate temperature is preferably low enough to prevent thermal decomposition of the gaseous reactants. On the other hand, the substrate temperature is preferably high enough to avoid the physisorption, or condensation of the source materials. Further, the substrate temperature is preferably sufficiently high to provide the activation energy for the surface reaction. The temperature of the substrate is preferably about 200° C. to 600° C., and more preferably about 250° C. to 400° C. However, one skilled in the art will recognize that the most preferable substrate temperature and reaction space pressure will depend on the identity of the reactants and the substrate.

If the partial pressure of the gaseous source compound exceeds the condensation limit at the substrate temperature, controlled, layer-by-layer growth of the transition metal carbide film is lost. Thus in the preferred embodiment the temperature of the source container is preferably set below the substrate temperature.

In the preferred embodiment, the transition metal source compound is chemisorbed on the substrate surface, forming a surface bound transition metal complex. The amount of reactants bound to the surface of the substrate by chemisorption will be determined by the surface itself. The reactant molecules will bind to the surface until no more available binding sites remain on the surface, and terminating ligands on the monolayer are non-reactive with excess source compound still in the vapor phase. This phenomenon is known as "self-saturation". Depending on the reactant employed, the physical size of the reactant molecules may prevent complete coverage of the surface when all of the binding sites are occupied. However, the preferred coverage on the substrate is obtained when no more than a single layer of transition metal source complex is adsorbed per pulsing sequence. Thus, several cycles may be necessary to produce a complete monolayer of transition metal carbide.

In a commercial production setting, the amount of time available for the self-saturating reactions is limited mostly by economic factors. For example, the required substrate throughput time for economic efficiency will impose a limit on the time available for the self-saturating reactions.

The substrate may be composed of any material known in the art. Examples include silicon, silica, coated silicon, metals, metal nitrides, metal oxides, porous materials, silicon carbide and silicon nitride. As discussed above, in the preferred embodiment, once a transition metal carbide thin film layer has been deposited by the present method, that layer will form the substrate surface for any subsequent layer.

The transition metal source compound and the carbon source compound are preferably chosen so that the requirements for sufficient vapor pressure, thermal stability at the substrate temperature and sufficient reactivity of the compounds on the substrate surface are fulfilled. Sufficient vapor pressure means that there are enough source compound molecules in the gas phase near the substrate surface to enable self-saturated reactions at the surface. Sufficient thermal stability means that the source chemical itself does not form growth-disturbing condensable phases on the substrate or leave harmful levels of impurities on the substrate surface through thermal decomposition. Thus, the reactants are preferably chosen to avoid uncontrolled condensation of atoms or molecules on the substrate.

According to the preferred embodiment of the present invention, a transition metal source material and a carbon source material are required. The carbon source material is preferably a boron source compound, a silicon source compound or a phosphorus source compound. However in one embodiment plasma is used and the preferred carbon source material is a hydrocarbon.

1. Transition Metal Source Materials

The preferred metal source compounds are transition metal compounds that are volatile at sufficiently low source temperatures. These transition metal compounds preferably comprise a transition metal selected from the group consisting of W, Ti, Zr, Hf, V, Nb, Ta, Cr and Mo. More preferably, the metal source compounds are metal halides, including metal fluorides and metal chlorides. In an illustrated preferred embodiment, the metal source material is tungsten hexafluoride.

2. Boron Source Compounds

The preferred boron source compounds are boron compounds that comprise at least one carbon atom and that are volatile at temperatures below the substrate temperature. More preferably the boron source materials are boron compounds that have at least one boron-carbon bond in the boron source compound molecule.

The boron source compound is preferably chosen from the following:

Carboranes according to formula I.

$$C_2B_nH_{n+x} \quad (I)$$

Wherein n is an integer from 1 to 10, preferably from 2 to 6, and x is an even integer, preferably 2, 4 or 6.

Examples of carboranes according to formula I include closo-carboranes ($C_2B_nH_{n+2}$), nido-carboranes ($C_2B_nH_{n+4}$) and arachno-carboranes ($C_2B_nH_{n+6}$).

Amine-borane adducts according to formula II.

$$R_3NBX_3 \quad (II)$$

Wherein

R is linear or branched C1 to C10, preferably C1 to C4 alkyl or H, and

X is linear or branched C1 to C10, preferably C1 to C4 alkyl, H or halogen.

Aminoboranes where one or more of the substituents on B is an amino group according to formula III.

$$R_2N \quad (III)$$

Wherein R is linear or branched C1 to C10, preferably C1 to C4 alkyl or substituted or unsubstituted aryl group.

An example of a suitable aminoborane is $(CH_3)_2NB(CH_3)_2$.

Alkyl borons or alkyl boranes, wherein the alkyl is typically linear or branced C1 to C10 alkyl, preferably C2 to C4 alkyl.

The alkylboron compounds are especially preferred. In the preferred embodiment the boron source material is triethylboron $(CH_3CH_2)_3B$.

3. Silicon Source Compounds

The preferred silicon source materials are carbon-containing silicon compounds that are volatile at temperatures below the substrate temperature. More preferably silicon source materials are silicon compounds that have at least one silicon-carbon bond in the silicon source chemical molecule. Even more preferably the silicon source materials are alkylsilicon compounds.

4. Phosphorus Source Compounds

The preferred phosphorous source materials are carbon-containing phosphorus compounds that are volatile at temperatures below the substrate temperature. More preferably the phosphorus source materials are phosphorus compounds that have at least one phosphorus-carbon bond in the phosphorus source chemical molecule. Even more preferably the phosphorus source materials are alkylphosphorus compounds.

5. Hydrocarbons

Hydrocarbons with a high hydrogen/carbon ratio are preferably used as carbon source chemicals. More preferably, linear or branched alkanes are used as carbon source chemicals.

In a preferred embodiment, the metal source gas and the carbon source gas do not exist in the gas phase in the reaction space at the same time. Preferably the source chemicals are alternately fed to the reaction space and contacted with the substrate surface, thus providing for ALD type growth of metal carbide on the substrate.

The by-products of the reaction between the surface bound transition metal compound and the carbon source compound are preferably gaseous and thus can easily be remove from the reaction space by varying the reaction space pressure and/or with inert gas flow. Preferably the carbon source compound leaves some carbon in the metal carbide film and takes halogens away from the substrate surface.

While the byproducts of the net reaction $WF_6+(CH_3CH_2)_3B$ have not been thoroughly analyzed, it is tentatively assumed that if a bond between carbon atoms is broken in the triethyl boron molecule when the molecule is near a tungsten fluoride molecule, some $CH_3F$ will be produced as a byproduct. Also it is tentatively assumed that if a bond between boron and carbon in the triethyl boron molecule is broken when the molecule is near a tungsten fluoride molecule, some $CH_3CH_2F$ and $BF_3$ will be produced as gas phase byproducts. However, the present invention is not limited to these tentative assumptions.

It is also possible that the carbon source chemical can change the oxidation state of the surface bound transition metal compound molecules. Analyses of thin films of the present invention revealed a high metal-to-carbon ratio $W_3C$ in the carbide thin film. This indicates a partial reduction of tungsten on the surface.

In one embodiment inert gas flow dilutes the byproducts of the reaction between the carbon source compound and the surface bound transition metal compound until the concentration of the gas phase byproducts is insignificant in the reaction space.

Preferably the carbon source compound leaves carbon in the growing transition metal carbide thin film. When a transition metal halide is used as a metal source compound, a halide byproduct may be formed in the reaction with the carbon source compound. For example, if a boron carbon source is used, a boron halide may be formed as a byproduct. The examples in Table 1 show that the resulting boron halides are volatile at a preferred substrate temperature, for example 350° C., and that they will not condense on the substrate surface. The volatility allows them to be removed from the reaction space as described above.

Boiling point temperatures in Tables 1 to 5 indicate that the vapor pressure of the compound is 1013 mbar (760 torr).

However, much lower vapor pressures, down to about 0.01 to 0.1 mbar are sufficient for ALD processes.

TABLE 1

Examples of Boron Halides
The following chart is derived from information in
N. N. Greenwood and A. Earnshaw, "Chemistry of Elements,
1st ed., Pergamon Press, Oxford, England 1986, p. 220, 225.

| Compound | Melting point [° C.] | Boiling point [° C.] |
|---|---|---|
| $BF_3$ | −127.1 | −99.9 |
| $BCl_3$ | −107 | +12.5 |
| $BBr_3$ | −46 | +91.3 |
| $BI_3$ | +49.9 | +210 |
| $B_2F_4$ | −56 | −34 |
| $B_2Cl_4$ | −92.6 | +65.5 |

Similarly, halogenated hydrocarbons have high volatility (Table 2) at a preferred substrate temperature, for example 350° C.

TABLE 2

Examples of Alkyl Halides
The following chart is derived from information contained
in CRC Handbook of Chemistry and Physics, 61st ed.,
Editor: R. C. Weast, CRC Press, Florida, USA 1981.

| Compound | Melting point [° C.] | Boiling point [° C.] |
|---|---|---|
| Methyl fluoride, $CH_3F$ | −141.8 | −78.4 |
| Methyl chloride, $CH_3Cl$ | −97.1 | −24.2 |
| Methyl bromide, $CH_3Br$ | −93.6 | +3.6 |
| Methyl iodide, $CH_3I$ | −66.4 | +42.4 |
| Tetrafluoro methane, $CF_4$ | −150 | −129 |
| Tetrachloro methane, $CCl_4$ | −23 | +76.5 |
| Ethyl fluoride, $CH_3CH_2F$ | −143.2 | −37.7 |
| Ethyl chloride, $CH_3CH_2Cl$ | −136.4 | +12.3 |
| Ethyl bromide, $CH_3CH_2Br$ | −118.6 | +38.4 |
| Ethyl iodide, $CH_3CH_2I$ | −108 | +72.3 |

Tables 3 and 4 show that byproducts consisting of silicon or phosphorus halides also have high vapor pressure, making it possible to utilize reactive organic silicon and phosphorus compounds as carbon sources for the metal carbide deposition.

TABLE 3

Examples of Silicon Halides
CRC Handbook of Chemistry and Physics, 61st ed., Editor:
R. C. Weast, CRC Press, Florida, USA 1981, pp. B-142–B-143)

| Compound | Melting point [° C.] | Boiling point [° C.] |
|---|---|---|
| $SiF_4$ | −90.2 | −86 |
| $SiCl_4$ | −70 | +57.6 |
| $SiBr_4$ | +5.4 | +154 |
| $SiI_4$ | +120.5 | +287.5 |
| $Si_2Cl_6$ | −1 | +145 |
| $SiCl_2F_2$ | −144 | −31.7 |
| $SiClF_3$ | −138 | −70 |
| $SiBr_2Cl_2$ | −45.5 | 104 |

TABLE 4

Examples of Phosphorus Halides
The following chart is derived from information contained
in N. N. Greenwood and A. Earnshaw, "Chemistry of Elements,
1st ed., Pergamon Press, Oxford, England 1986, p. 568, 572.

| Compound | Melting point [° C.] | Boiling point [° C.] |
|---|---|---|
| $PF_3$ | −151.5 | −101.8 |
| $PCl_3$ | −93.6 | +76.1 |
| $PBr_3$ | −41.5 | +173.2 |
| $PI_3$ | +61.2 | |
| $P_2F_4$ | −86.5 | −6.2 |
| $P_2Cl_4$ | −28 | |
| $P_2I_4$ | +125.5 | |
| $PF_5$ | −93.7 | −84.5 |
| $PCl_5$ | +167 | +160 (subl.) |
| $PI_5$ | +41 | |
| $PCl_4F$ | −59 | +67 |
| $PCl_2F_3$ | −125 | +7.1 |
| $PClF_4$ | −132 | −43.4 |

TABLE 5

Examples of Commercial Carbon Source Chemicals from Sigma Aldrich
Carbon sources that are useful for the metal carbide depositions
disclosed herein and that are commercially available include:

| Compound | Synonym | Boiling point |
|---|---|---|
| Triethylborane $(CH_3CH_2)_3B$ | triethylboron | +95 |
| Tetraethylsilane $(CH_3CH_2)_4Si$ | tetraethylsilicon | +153 |
| Tetramethylsilane $(CH_3)_4Si$ | tetramethylsilicon | +27 |
| Triethylphosphine $(CH_3CH_2)_3P$ | triethylphosphor | +127 |

EXAMPLE 1

The Deposition of Tungsten Carbide from $WF_6$ and $(CH_3CH_2)_3B$

Tungsten hexafluoride $WF_6$ was used as the metal source chemical and triethyl boron $(CH_3CH_2)_3B$ was used as the carbon source to produce a transition metal carbide thin film on a substrate.

A silicon wafer was loaded into the reaction space of a Pulsarm™ 2000 reactor, commercially available from ASM Microchemistry Oy of Espoo, Finland, which is designed for ALD processes. The reaction space was evacuated with a mechanical vacuum pump. After evacuation the pressure of the reaction space was adjusted to about 5 mbar–10 mbar (absolute) with flowing nitrogen gas that had a purity of 99.9999%. Then the reaction space was allowed to stabilize at about 350° C. Alternating pulses of electronic grade $WF_6$ and $(CH_3CH_2)_3B$ were vaporized from external sources, introduced into the reaction space and contacted with the substrate surface. The source compound pulses were separated from each other by purging with flowing nitrogen gas. The pulsing cycle consisted of the two source compound pulses and the two nitrogen purges. The pulsing cycle was repeated 167 times.

The pulsing and purging times of the pulsing cycle were as follows:

| | |
|---|---|
| $WF_6$ pulse | 0.25 s |
| $N_2$ purge | 3.0 s |
| $(CH_3CH_2)_3B$ pulse | 0.5 s |
| $N_2$ purge | 3.0 s |

Optimization of the process conditions shortens the purging times relative to the above-described cycle.

After the deposition process, the silicon substrate was unloaded from the reactor for inspection and analysis. The thin film covered the whole top surface of the substrate and it had a metallic luster and gray color. It had good adhesion to the wafer and was electrically conductive. Thin film samples were analyzed with TOF-ERDA (Time-Of-Flight Elastic Recoil Detection Analysis) for elements, with EDS (Electron Diffraction Spectroscopy) for thin film thickness and with four-point probe for sheet resistance. Resistivity was calculated from the thickness and sheet resistance values.

According to TOF-ERDA, the thin film samples consisted of tungsten and carbon in an atomic ratio corresponding to $W_3C$. The thickness of the samples was about 23 nm, indicating that the growth rate of the tungsten carbide film had been about 1.4 Å/cycle. This value is below the lattice constant of tungsten carbide, possibly due to the molecular size of the precursors that occupy more of the substrate surface than tungsten and carbon atoms do. The resistivity of the film was in the range of 200 micro-ohm-cm. The films had only about 1.0 atomic %–1.5 atomic % of fluorine as an impurity.

EXAMPLE 2

General Description of the Metal Carbide Film Deposition Process

A substrate is placed into a reaction space. The reaction space is adjusted to a preferred temperature and the gas atmosphere of the reaction space is adjusted to a preferred pressure. A repeatable process sequence consisting of four basic steps is then begun. A vapor phase pulse of a transition metal source compound is introduced to the reaction space and contacted with the substrate surface. After a first contact time the surplus transition metal source compound and any reaction byproducts are removed from the reaction space by varying the reaction space pressure and/or by inert gas flow. After the first purging time a vapor phase pulse of a carbon source compound is introduced to the reaction chamber and contacted with the substrate surface. After a second contact time the surplus carbon source compound and any reaction byproducts are removed from the reaction space by varying the reaction space pressure and/or by inert gas flow. After the second purging time the process sequence may be repeated until a metal carbide thin film of a specified thickness is obtained. Finally, the substrate having a thin film is transported from the reaction chamber.

The carbon source compound may be a boron, silicon or phosphorus carbon source compound.

EXAMPLE 3

ALD Metal Carbides as Diffusion Barriers for Integrated Circuits

Figure 1:
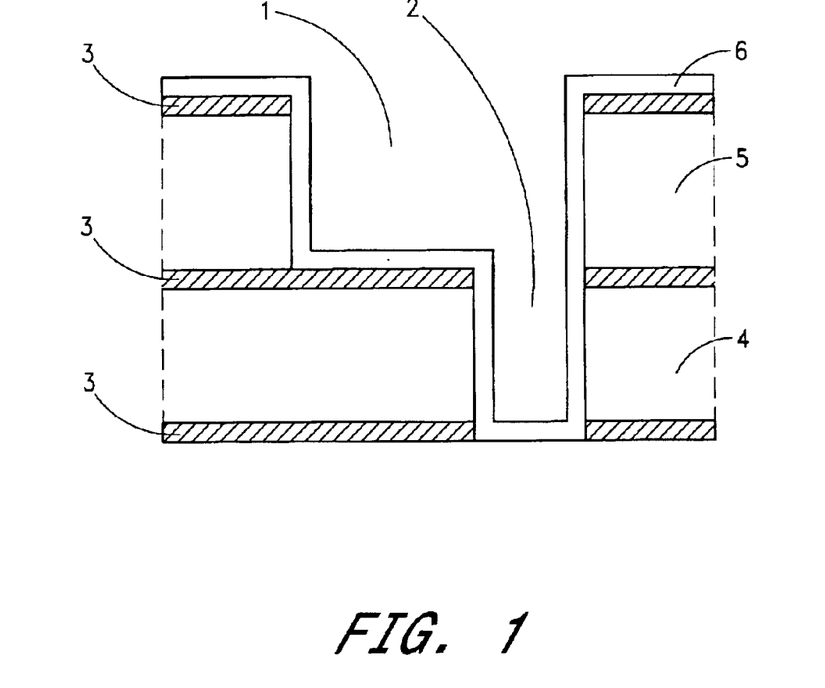
FIG. 1 presents a schematic view of a dual damascene structure and the placement of the metal carbide diffusion barrier.

A substrate, as shown in FIG. 1, having trench 1 and via 2 openings, etch stop layers 3, via insulator 4 and trench insulator 5 is placed in the reaction space of an ALD reactor. The reaction space is evacuated to vacuum and the pressure of the reaction space is adjusted to a preferred pressure with an inert gas, preferably nitrogen. A preferred pressure is in the range of about 1 mbar to 50 mbar, more preferably about 3 mbar to 10 mbar. The temperature of the reaction space is then stabilized at the preferred process temperature. The temperature is preferably in the range of 300° C. to 425° C., more preferably in the range of about 325° C. to 375° C., and is most preferably set at about 350° C. A transition metal carbide layer 6 is then produced on the substrate by the following cycle:

a transition metal source compound is introduced into the reaction space and contacted with the substrate for a first pulse time;

surplus transition metal source compound molecules and any byproduct molecules are removed from the reaction space during the first purge time;

a carbon source compound is introduced to the reaction space and contacted with the substrate for a second pulse time;

surplus carbon source compound molecules and any byproduct molecules are removed from the reaction space during the second purge time.

The transition metal source compound is preferably selected from the group consisting of Ti, Zr, Hf, V, Nb, Ta, Cr, Mo and W compounds. Metal halide compounds are more preferred. The carbon source compound is selected from the group consisting of boron, silicon and phosphorus compounds that contain carbon. Alkyl borons, alkyl silicons and alkyl phosphorus compounds are more preferred.

During the purge time, inert or noble gas is introduced to the reaction space to dilute the surplus compound and byproduct concentration to an insignificant level by forcing these molecules to enter the pumping line.

Each pulsing cycle increases the thickness of the film by up to one molecular layer of metal carbide. The exact number of the pulsing cycles depends on the application and the desired thickness of the film.

The transition metal carbide layer may serve as a diffusion barrier. The substrate may then be further manipulated, such as by the deposition of a metal seed layer.

EXAMPLE 4

Coating Tools with Metal Carbide in a Batch Process

It would be beneficial to provide bits for drilling that have an extended useful life. This may be achieved by coating them with a metal carbide. Because the ALD type process of the present invention is not sensitive to the sample geometry, a batch process can be used. Thus, parts to be coated may be relatively small. The ability to use a batch process also decreases the coating costs per part significantly.

A number of bits are set in a substrate holder that is then loaded into the reaction space of a batch reactor. The reaction space is evacuated to vacuum. The pressure of the reaction space is adjusted to a preferred pressure with an inert gas, preferably nitrogen. A preferred pressure is in the range of about 1 mbar to 50 mbar, more preferably about 3 mbar to 10 mbar. The temperature of the reaction space is then stabilized at the preferred process temperature. The temperature is preferably in the range of about 300° C. to 425° C., more preferably in the range of about 325° C. to 375° C., and in the illustrated embodiment is set at about 350° C.

The transition metal carbide deposition process consists of the following repeatable process steps that form a pulsing cycle:

a transition metal source compound is introduced into the reaction space and contacted with the substrates for a first pulse time;

surplus transition metal source compound molecules and any byproduct molecules are removed from the reaction space during a first purge time;

a carbon source compound is introduced to the reaction space and contacted with the substrates for a second pulse time;

surplus carbon source compound molecules and any byproduct molecules are removed from the reaction space during a second purge time.

The transition metal source compound is preferably selected from the group consisting of Ti, Zr, Hf, V, Nb, Ta, Cr, Mo and W compounds. Metal halide compounds are more preferred. The carbon source chemical is selected from the group consisting of volatile boron, silicon and phosphorus compounds that contain carbon. Alkyl borons, alkyl silicons and alkyl phosphorus compounds are more preferred.

During the purge time, inert or noble gas is introduced to the reaction space to dilute the surplus compound and byproduct concentration to an insignificant level by forcing these molecules to enter the pumping line.

Each pulsing cycle increases the thickness of the film by up to one molecular layer of metal carbide. The exact number of the pulsing cycles depends on the application and the desired thickness of the film.

EXAMPLE 5

ALD Grown Metal Carbide as a Starting Surface for Diamond Deposition

Metal carbide thin films may serve as a nucleation surface for the growth of diamond thin film. Metal carbide thin films are deposited on a substrate by the ALD type process of the present invention. The metal carbide thin film may then be used as a starting layer for the subsequent deposition of diamond thin film on the substrate.

EXAMPLE 6

Electrical Contacts to SiC with the Help of ALD Metal Carbides

In order to improve the process of making electrical contacts to a silicon carbide surface, an intermediate layer consisting of a metal carbide thin film is produced by the ALD type process of the present invention. A silicon carbide substrate is provided. The substrate surface has enough reactive sites for the nucleation of the first few metal carbide molecular layers. The most critical part of the process is the adsorption of the first molecular layer of the ALD source chemical on the silicon carbide surface. The deposition process can be started either with the metal source chemical or the carbon source chemical.

EXAMPLE 7

ALD Metal Carbides as an Adhesion Layer

Metal carbide thin films may be used as an intermediate layer on a substrate to improve the adhesion of a subsequent material layer deposited on the substrate. The metal carbide thin film is produced according to the deposition process described above.

EXAMPLE 8

Deposition of Metal Carbides in an ALD Process with Plasma

Adding pulsed plasma to the deposition process of the present invention allows for the use of a lower deposition temperature. It also makes it possible to use fragments of organic compounds in the form of radicals for the deposition of metal carbide thin film by an ALD type process.

In this embodiment, a substrate is first placed in the reaction space. The pressure of the reaction space is set to a preferred pressure with a vacuum pump and flowing inert gas. The temperature of the reaction space is set to a preferred temperature and the deposition process is started.

The deposition process comprises the following repeatable pulse and purge steps that form the basic deposition cycle:

metal source compound is introduced into the reaction chamber and contacted with the substrate for a first pulse time;

surplus metal source compound molecules and any byproduct molecules are removed from the reaction space during a first purge time;

carbon source compound is introduced into the reaction chamber in the form of plasma radicals and contacted with the substrate for a second pulse time;

surplus carbon source compound molecules and any byproduct molecules are removed from the reaction space during a second purge time.

The maximum deposition rate of the metal carbide thin film that allows for controlled thickness uniformity is one molecular layer per cycle. The carbon source compound is preferably an organic compound that contains only carbon and hydrogen. The carbon source compound is preferably turned into plasma with UV radiation, electric arc, RF generator or any other method known in the art that is capable of forming plasma from gas atoms or molecules. The resulting radicals preferably have a high hydrogen/carbon ratio, thus improving the volatility of these species and decreasing the possibility of obtaining a low-volatility carbon-rich coating on the substrate. Because this embodiment utilizes pulsed plasma, it is preferable to switch off or redirect the plasma source during the metal source compound pulse to avoid uncontrolled deposition of metal on the substrates.

The cycle may be repeated as many times as necessary to produce a film of the desired thickness. After the deposition process the substrate is unloaded from the reaction space.

EXAMPLE 9

ALD Deposition of Metal Carbides for Catalysts

Substrate material is loaded to a substrate holder. In the case of powders having high area/volume ratio, the substrate holder consists of a length of container having a sinter on both ends. The substrate holder may be placed horizontally in the reaction space. In this orientation the substrate holder is filled with substrate powder so that there is no free gas space inside the substrate holder. In this orientation the source compound gases and purging gas preferably go through the powder. The substrate holder may alternatively be placed vertically in the reaction space. In this orientation there may be some free gas space left inside the substrate holder so that the substrate powder can float in the gas stream that preferably comes through the bottom sinter and exits through the top sinter.

Transition metal carbide is deposited on the substrate surface by the ALD type process described above. However, in this embodiment source compound gases are preferably directed through the container holding the powder, thus ensuring that the gas contacts the particles of the powder. Due to the large surface area to be coated the pulse and purge times are preferably extended compared to the values provided for non-powder substrates.

EXAMPLE 10

ALD Metal Carbides as Corrosion Protection

Bearings are an example of parts that may benefit from a hard, protective outer layer when used in corroding atmospheres. A set of bearings is loaded into a perforated substrate holder. The holes on the substrate holder have a conical opening at the upper surface of the holder. The bearings rest on the bottom of these shallow cones. The substrate holder is transported into the reaction space where it is connected to the source gas and inert gas lines. The reaction space is evacuated to vacuum. The pressure of the reaction chamber is adjusted with flowing inert gas to the preferred processing pressure. Inert gas enters the reaction chamber through the holes of the substrate holder and raises the bearings from the bottom of the cones. The bearings preferably rotate freely in the flowing nitrogen streams (Bernoulli's principle) and they are not in contact with any solid surface during the deposition process. The temperature of the reaction space is adjusted to the preferred deposition temperature.

The ALD type metal carbide deposition process is started and comprises the following steps:

metal source compound is introduced to the reaction space and contacted with the substrates for a first pulse time;

surplus metal source compound molecules and any byproduct molecules are removed from the reaction space during a first purge time;

carbon source compound is introduced to the reaction space and contacted with the substrates for a second pulse time;

surplus carbon source compound molecules and any byproduct molecules are removed from the reaction space during a second purge time.

Source chemical gases flow through the conical holes of the substrate holder and contact the bearings that are held in the vertical gas streams. The process forms up to a molecular layer of metal carbide per pulsing cycle. After the deposition process, nitrogen flow is slowly decreased until the bearings have returned to the bottom of the cones. The substrate holder may be unloaded through a load lock or the pressure of the reaction chamber may be increased to the external room pressure with inert gas and the substrate holder unloaded without the use of a load lock chamber.

Although the foregoing invention has been described in terms of certain preferred embodiments, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A method of producing a thin film by an atomic layer deposition (ALD) process, in which each of a plurality of cycles comprises exposing an adsorbed metal complex on a substrate to a carbon compound, the carbon compound reacting with the adsorbed metal complex to form no more than about one monolayer of metal carbide, wherein the carbon compound is selected from the group consisting of organic boron compounds, organic silicon compounds and organic phosphorus compounds.

2. The method of claim 1, wherein at least a portion of the metal source gas adsorbs upon the substrate, thereby producing the adsorbed metal complex.

3. The method of claim 1, wherein the metal complex comprises a metal selected from the group consisting of Ti, Zr, Hf, V, Nb, Ta, Cr, Mo and W.

4. The method of claim 1, wherein vapor-phase pulses are alternately introduced in a cycle comprising:

introducing a metal source gas into a reaction space containing the substrate to form the adsorbed metal complex;

removing excess metal source gas and any gaseous reaction byproducts from the reaction space;

introducing the carbon compound into the reaction space; and removing excess carbon compound and any gaseous reaction byproducts from the reaction space.

5. The method of claim 4, wherein the adsorbed metal complex forms no more than about one monolayer.

6. The method of claim 4, wherein the carbon compound reacts with the adsorbed metal complex to leave a transition metal carbide.

7. The method of claim 4, wherein gaseous reaction byproducts are formed by the reaction of the adsorbed metal complex with the carbon compound.

8. The method of claim 4, wherein the metal source gas and carbon compound are each fed into the reaction space with the aid of an inert carrier gas.

9. The method of claim 4, further comprising feeding an inert gas pulse to the reaction space after each pulse of metal source gas and carbon compound.

10. The method of claim 4, wherein the metal source gas is a transition metal halide.

11. The method of claim 10, wherein the metal source gas is tungsten hexafluoride.

12. The method of claim 1, wherein the carbon compound comprises a volatile boron compound comprising at least one boron atom and at least one carbon atom.

13. The method of claim 12, wherein the boron compound is an alkyl boron compound.

14. The method of claim 13, wherein the boron compound is triethylboron.

15. The method of claim 1, wherein the carbon compound comprises a volatile silicon compound comprising at least one silicon atom and at least one carbon atom.

16. The method of claim 15, wherein the silicon compound is an alkylsilicon compound.

17. The method of claim 1, wherein the carbon compound comprises a volatile phosphorous compound comprising at least one phosphorous atom and at least one carbon atom.

18. The method of claim 17, wherein the phosphorous source compound is an alkylphosphorus compound.

19. The method of claim 1, wherein the metal carbide forms part of a conductive diffusion barrier in an integrated circuit.

20. The method of claim 19, wherein the conductive diffusion barrier comprises a liner in a dual damascene void.

21. The method of claim 1, wherein the metal carbide forms part of a hard coating on a substrate to protect against mechanical wear.

22. The method of claim 1, wherein the metal carbide forms part of a corrosion protection layer.

23. The method of claim 1, wherein the metal carbide forms part of a chemical reaction catalyst.

24. The method of claim 1, wherein the carbon compound comprises radicals generated in a plasma formed from an organic boron compound.

25. The method of claim 24, wherein the organic boron compound is an alkyl boron compound.

26. The method of claim 25, wherein the alkyl boron compound is triethylboron.

27. A method of producing a metal carbide thin film in an integrated circuit by an atomic layer deposition (ALD) process, in which each of a plurality of cycles comprises:

introducing a metal source gas into a reaction space containing a substrate to form an adsorbed metal complex;

removing excess metal source gas and any gaseous reaction byproducts from the reaction space;

introducing an organic boron compound into the reaction space; and removing excess organic boron compound and any gaseous reaction byproducts from the reaction space.

28. The method of claim 27, wherein the metal source gas comprises a transition metal halide.

29. The method of claim 28, wherein the transition metal halide comprises a transition metal fluoride.

30. The method of claim 29, wherein the transition metal fluoride comprises tungsten fluoride.

31. The method of claim 29, wherein the transition metal fluoride comprises tantalum fluoride.

32. The method of claim 29, wherein the transition metal fluoride comprises titanium fluoride.

33. The method of claim 27, wherein the organic boron compound is selected from the group consisting of carboranes, amine-borane adducts, aminoboranes, alkyl borons and alkyl boranes.

34. The method of claim 27, wherein the organic boron compound comprises an alkyl boron.

35. The method of claim 34, wherein the alkyl boron comprises triethylboron.

* * * * *

UNITED STATES PATENT AND TRADEMARK OFFICE
CERTIFICATE OF CORRECTION

| | | |
|---|---|---|
| PATENT NO. | : 6,800,552 B2 | Page 1 of 1 |
| APPLICATION NO. | : 10/246131 | |
| DATED | : October 5, 2004 | |
| INVENTOR(S) | : Elers et al. | |

It is certified that error appears in the above-identified patent and that said Letters Patent is hereby corrected as shown below:

Col. 6, line 30, please delete "remove" and insert --removed--, therefor.

Col. 8, line 42, please delete "Pulsarm™" and insert --Pulsar™--, therefor.

Signed and Sealed this

Fifth Day of December, 2006

JON W. DUDAS
*Director of the United States Patent and Trademark Office*